(12) United States Patent
Xu et al.

(10) Patent No.: US 8,809,171 B2
(45) Date of Patent: Aug. 19, 2014

(54) METHODS FOR FORMING FINFETS HAVING MULTIPLE THRESHOLD VOLTAGES

(71) Applicant: Taiwan Semiconductor Manufacturing Company, Ltd., Hsin-Chu (TW)

(72) Inventors: Jeffrey Junhao Xu, Jhubei (TW); Ying Zhang, Hsin-Chu (TW); Ziwei Fang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 51 days.

(21) Appl. No.: 13/748,419

(22) Filed: Jan. 23, 2013

(65) Prior Publication Data

US 2014/0187013 A1 Jul. 3, 2014

Related U.S. Application Data

(60) Provisional application No. 61/747,066, filed on Dec. 28, 2012.

(51) Int. Cl.
*H01L 21/425* (2006.01)
(52) U.S. Cl.
USPC ........................................... 438/514; 438/524

(58) Field of Classification Search
USPC .................................. 438/514, 524, 525, 520
See application file for complete search history.

(56) References Cited

U.S. PATENT DOCUMENTS

2011/0068407 A1 3/2011 Yeh et al.

FOREIGN PATENT DOCUMENTS

| KR | 20110033033 | 3/2011 |
| KR | 20120098843 | 9/2012 |
| WO | 2011087571 | 7/2011 |

*Primary Examiner* — Reema Patel
(74) *Attorney, Agent, or Firm* — Slater and Matsil, L.L.P.

(57) ABSTRACT

A method includes forming a first and a second gate stack to cover a first and a second middle portion of a first and a second semiconductor fin, respectively, and performing implantations to implant exposed portions of the first and the second semiconductor fins to form a first and a second n-type doped region, respectively. A portion of each of the first and the second middle portions is protected from the implantations. The first n-type doped region and the second n-type doped region have different gate proximities from edges of the first gate stack and the second stack, respectively. The first and the second n-type doped regions are etched using chlorine radicals to form a first and a second recess, respectively. An epitaxy is performed to re-grow a first semiconductor region and a second semiconductor region in the first recess and the second recess, respectively.

20 Claims, 14 Drawing Sheets

METHODS FOR FORMING FINFETS HAVING MULTIPLE THRESHOLD VOLTAGES

This application claims the benefit of the following provisionally filed U.S. Patent Application Ser. No. 61/747,066, filed Dec. 28, 2012, and entitled "Methods for Forming FinFETs Having Multiple Threshold Voltages," which application is hereby incorporated herein by reference.

BACKGROUND

In the formation of a Field-Effect Transistor (FinFET), a semiconductor fin is formed first, followed by forming a gate stack on a portion of the semiconductor fin. The exposed end portions of the fin on opposite sides of the gate stack are removed to form recesses. Source and drain regions are then re-grown in the recesses through epitaxy.

The performance of Field-Effect Transistors (FinFETs) is strongly affected by the profiles of source and drain regions, which profiles include, for example, the degree of undercut, which is how much the recesses extend under the gate stack. To maintain a controllable performance, it is desired that the magnitude of the undercuts can be controlled accurately. Furthermore, it is desirable that the undercuts are uniform throughout the same type of FinFETs on the same chip. The undercut control, however, is difficult to achieve. For example, due to the pattern loading effect caused by the pattern density of the exposed fin portions, the undercuts may vary significantly. Controlling the undercuts thus becomes a challenge.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

The method of forming Fin Field-Effect Transistors (FinFETs) with multiple threshold voltages is provided in accordance with various exemplary embodiments. The intermediate stages of forming the FinFETs are illustrated. The variations of the embodiments are discussed. Throughout the various views and illustrative embodiments, like reference numbers are used to designate like elements.

Figure 1:
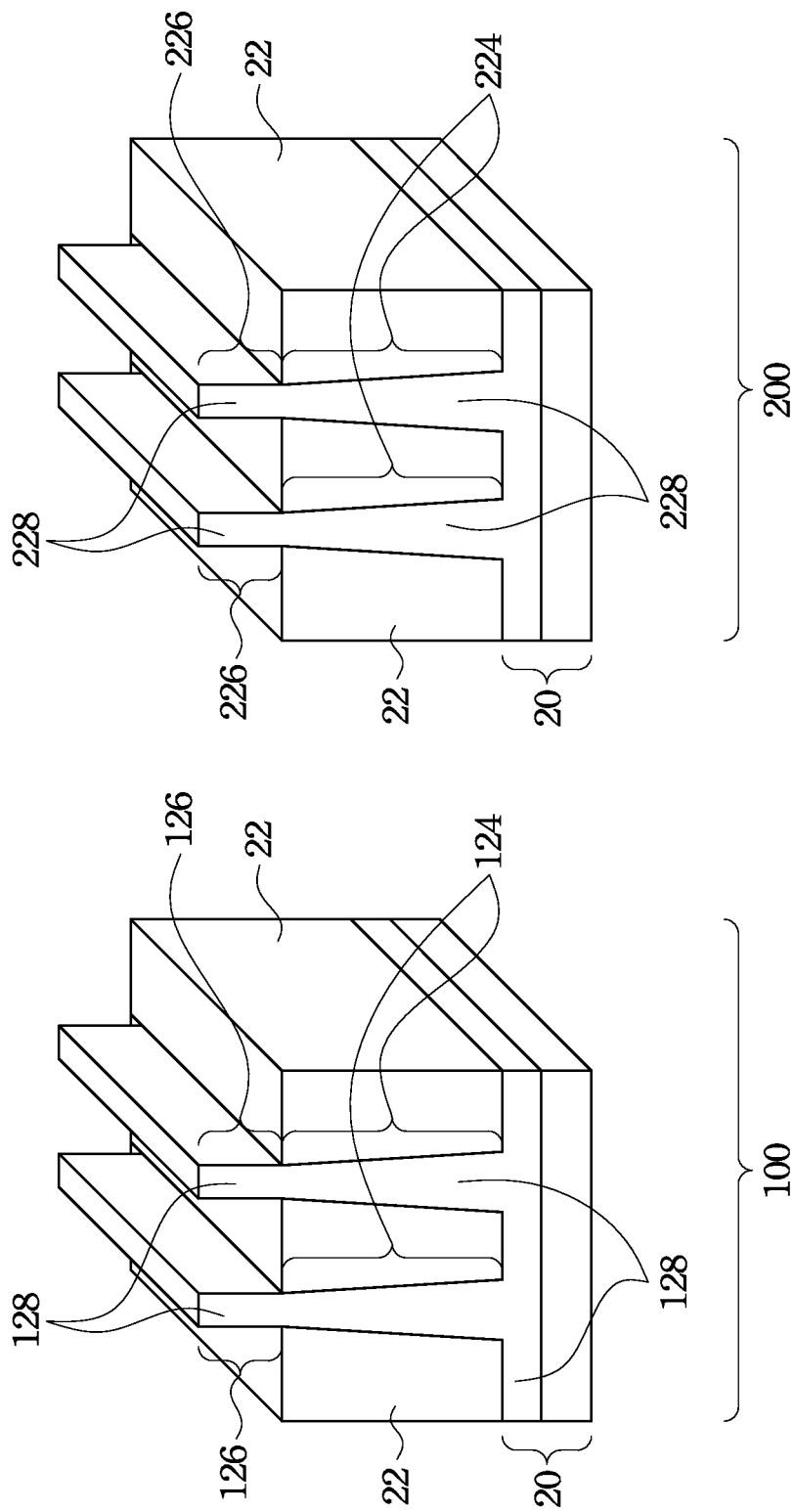
FIGS. 1 through 7B are cross-sectional views and perspective views of intermediate stages in the manufacturing of Fin Field-Effect Transistors (FinFETs) in accordance with some exemplary embodiments.

FIGS. 1 through 7B illustrate perspective views and cross-sectional views in the formation of FinFETs in accordance with exemplary embodiments. FIG. 1 illustrates a perspective view of a structure including substrate 20, isolation regions 22, semiconductor strips 124 and 224 between isolation regions 22, and semiconductor fins 126 and 226 over the top surface of isolation regions 22. Substrate 20 may be a semiconductor substrate, which may further be a silicon substrate, a silicon carbon substrate, or a substrate formed of other semiconductor materials. Substrate 20 may be lightly doped with a p-type or an n-type impurity. Substrate 20 includes a first portion in region 100, and a second portion in region 200. Although the portion of substrate 20 between the first portion and the second portion of substrate 20 is not shown, the first portion and the second portion belong to a continuous substrate 20.

Isolation regions 22 may be, for example, Shallow Trench Isolation (STI) regions. The formation of STI regions 22 may include etching semiconductor substrate 20 to form trenches (not shown), and filling the trenches with a dielectric material to form STI regions 22. STI regions 22 may comprise silicon oxide, for example, although other dielectric materials such as nitrides may also be used. Semiconductor fins 126 and 226 may overlap the underlying semiconductor strips 124 and 224, respectively. The formation of semiconductor fins 126 and 226 may include forming STI regions 22 to have top surfaces level with the top surfaces of semiconductor fins 126 and 226, and recessing STI regions 22, so that the portions of STI regions 22 on the opposite sides of semiconductor fins 126 and 226 are removed. Semiconductor fins 126 and 226 and some or substantially entireties of semiconductor strips 124 and 224 may comprise substantially pure silicon or other silicon-containing compound including, and not limited to, silicon carbon, silicon germanium, or the like.

In some embodiments, a well doping is performed, for example, through an implantation step, and well regions 128 and 228 are formed. Well regions 128 and 228 extend into semiconductor fins 126 and 226, and at least top portions of semiconductor strips 124 and 224, respectively. Well regions 128 and 228 may also extend into the portions of substrate 20 that are below the bottom surfaces of STI regions 22. If n-type FinFETs are to be formed, well regions 128 and 228 may be p-well regions comprising a p-type impurity such as boron, indium, or the like. Otherwise, if p-type FinFETs are to be formed, well regions 128 and 228 may be n-well regions comprising an n-type impurity such as phosphorous, arsenic, antimony, or the like. The doping concentration in well regions 128 and 228 may be lower than about $1 \times 10^{18}/cm^3$, and may be between about $1 \times 10^{16}/cm^3$, and about $1 \times 10^{18}/cm^3$.

Figure 2:
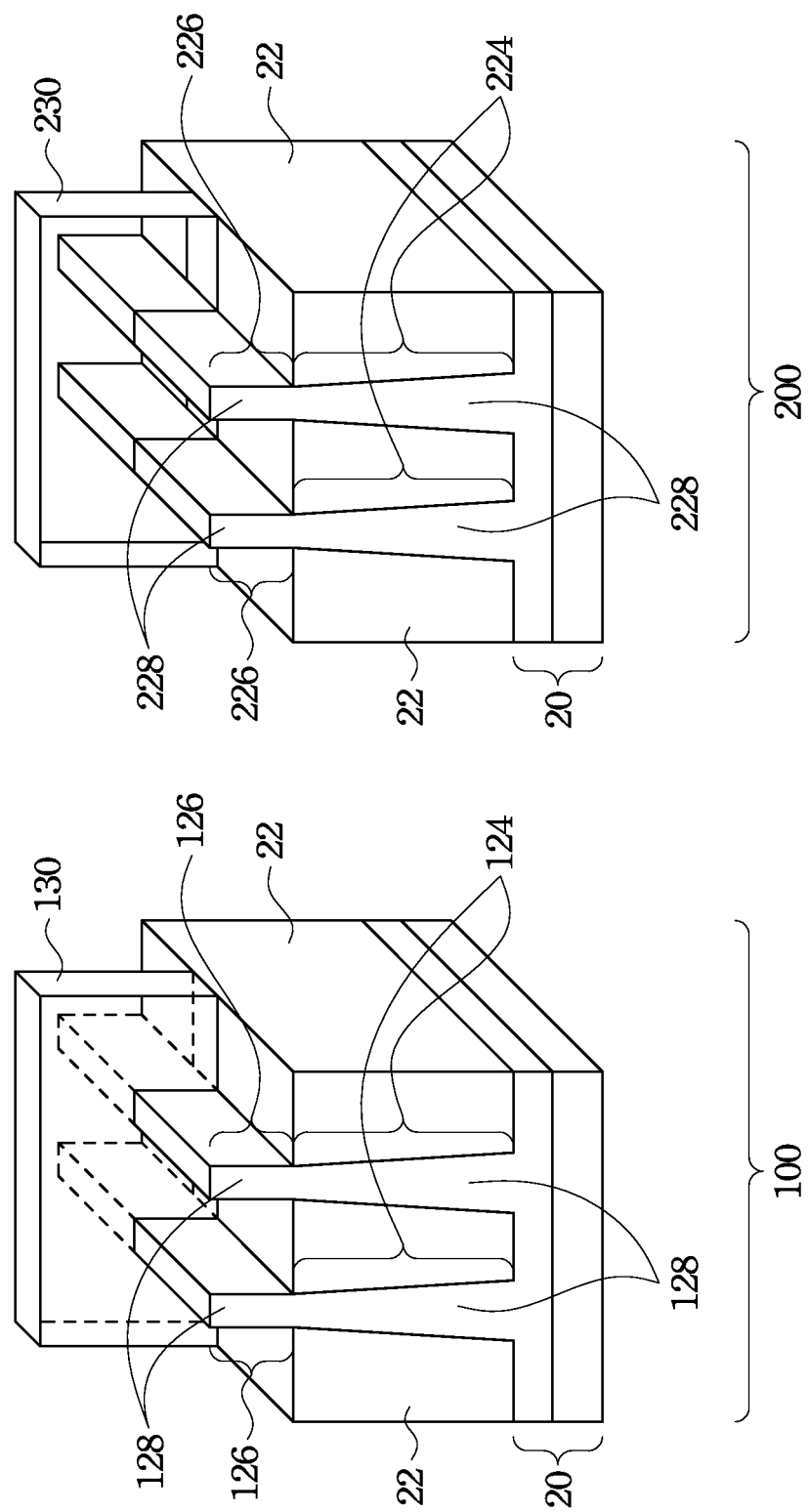

FIG. 2 illustrates a perspective view in the formation of gate stacks 130 and 230. Gate stacks 130 and 230 cover the middle portions of semiconductor fins 126 and 226, and leaving the end portions of semiconductor fins 126 and 226 uncovered. Furthermore, stacks 130 and 230 are formed on the sidewalls and the top surfaces of the middle portions of semiconductor fins 126 and 226, respectively.

In some embodiments, stacks 130 and 230 remain in the resulting FinFETs, and form the gate stacks of the FinFETs. For clarity, the inner structure of gate stacks 130 and 230 are not shown in perspective views of the present disclosure. The inner structures of gate stacks 130 and 230 are schematically illustrated in FIG. 3B in accordance with exemplary embodiments. As shown in FIG. 3B, gate stack 130 includes gate dielectric 132 on the sidewalls and the top surfaces of semiconductor fins 126, and gate electrode 134 over gate dielectric 132. Gate stack 230 includes gate dielectric 232 on the sidewalls and the top surfaces of semiconductor fins 226, and gate electrode 234 over gate dielectric 232. Gate dielectrics 132 and 232 may be selected from silicon oxide, silicon nitride, gallium oxide, aluminum oxide, scandium oxide, zirconium oxide, lanthanum oxide, hafnium oxide, combinations thereof, and multi-layers thereof. Gate electrodes 134 and 234 may include a conductive material that includes polysilicon, a refractory metal or the respective compound including, e.g., titanium (Ti), TiAl, TaC, TaCN, TaAlC, TaAlCN, TiN, TiW, and tungsten (W). In other examples, gate electrodes 134 and 234 include nickel (Ni), gold (Au), copper (Cu), or the alloys thereof.

In alternative embodiments, gate stacks 130 and 230 form dummy gate stacks that will be replaced by replacement gates in subsequent steps. Accordingly, gate stacks 130 and 230 may include dummy gate electrodes (which are also referred to as 134 and 234). Dummy gate dielectrics 132 and 232 may, or may not, be formed between dummy gate electrodes 134 and 234 and the respective underlying semiconductor fins 126 and 226. Dummy gate electrodes 134 and 234 may comprise polysilicon, for example. Gate spacers (not shown) may or may not be formed as parts of gate stack 130 and 230 in these embodiments.

Figure 3A:
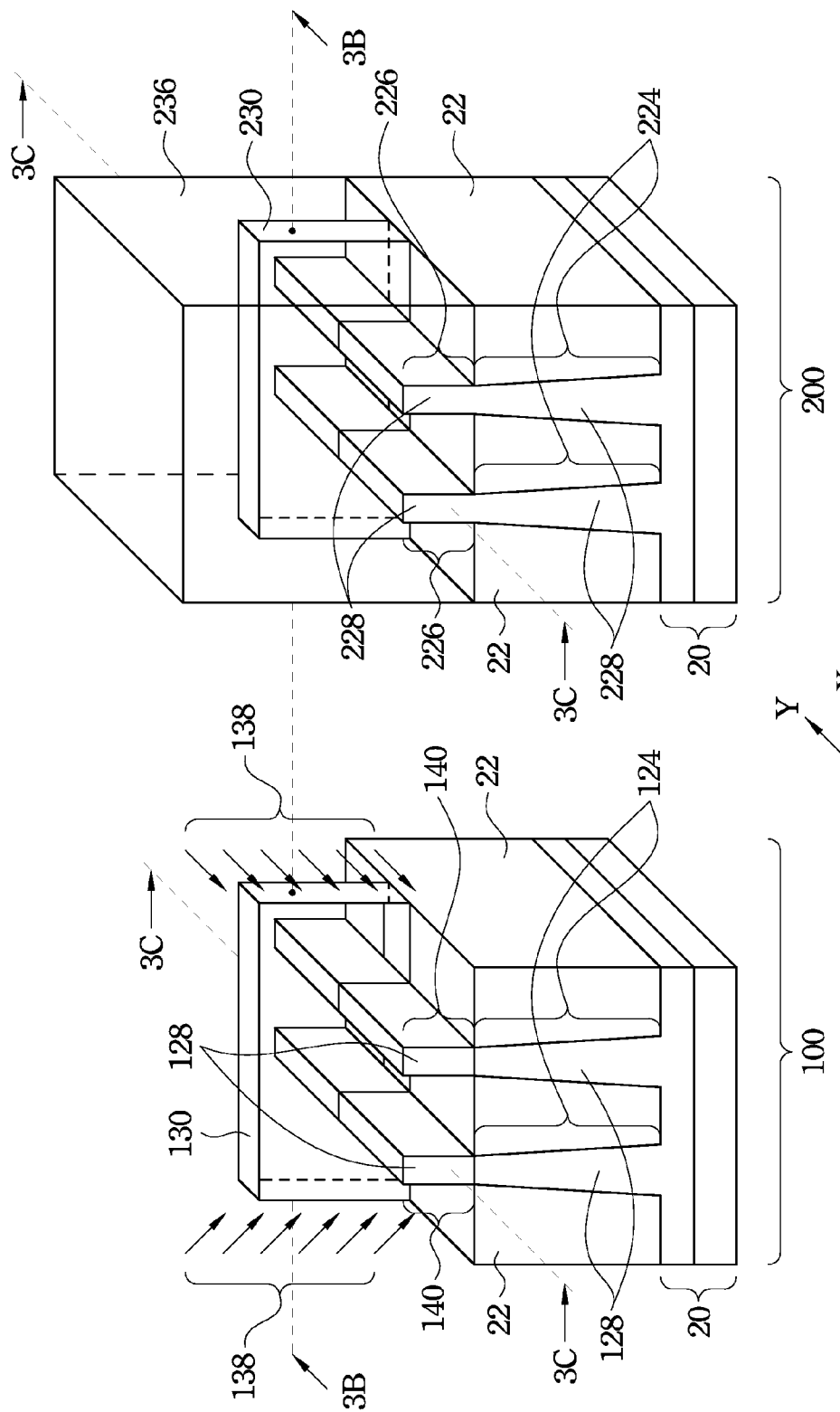
Figure 3B:
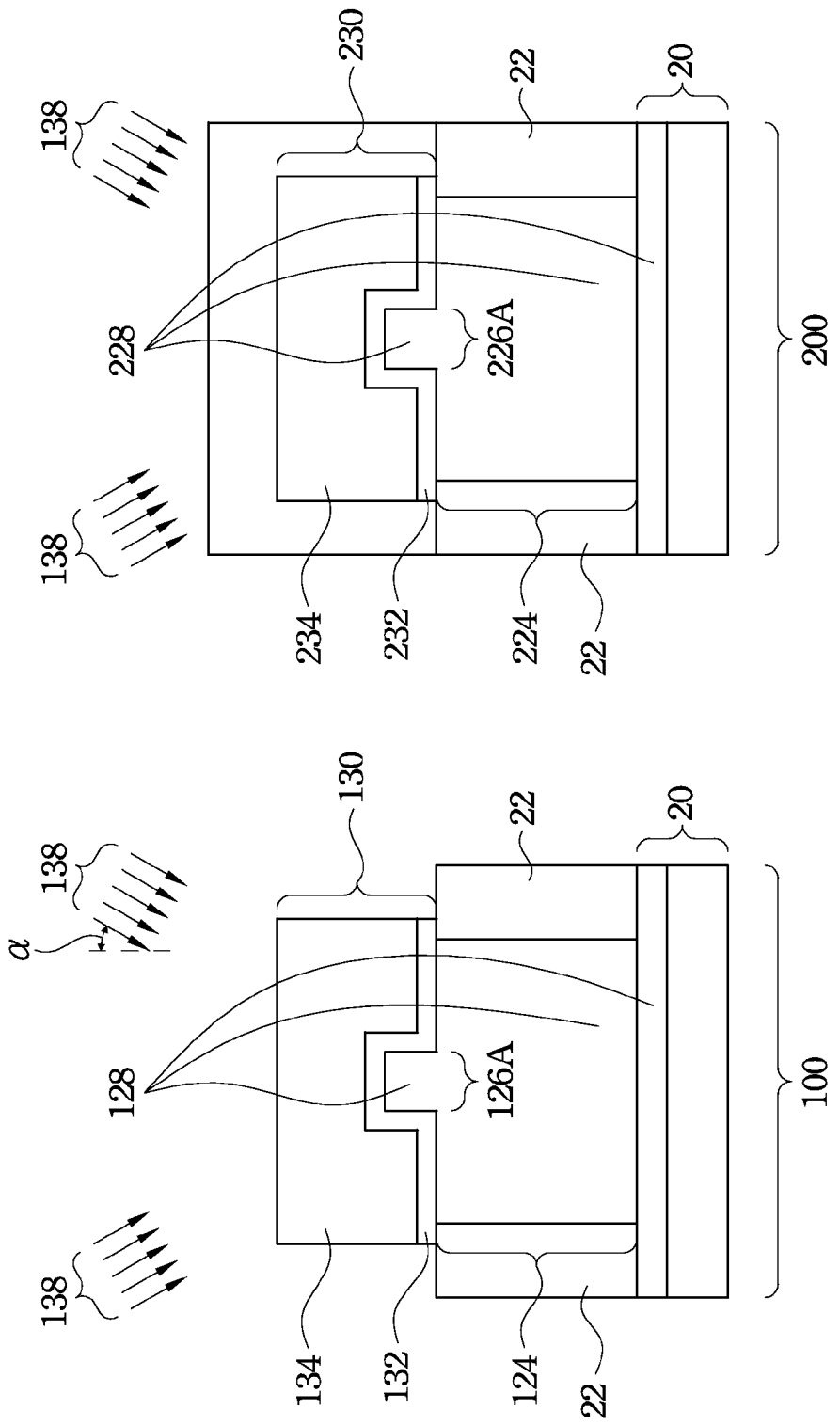
Figure 3C:
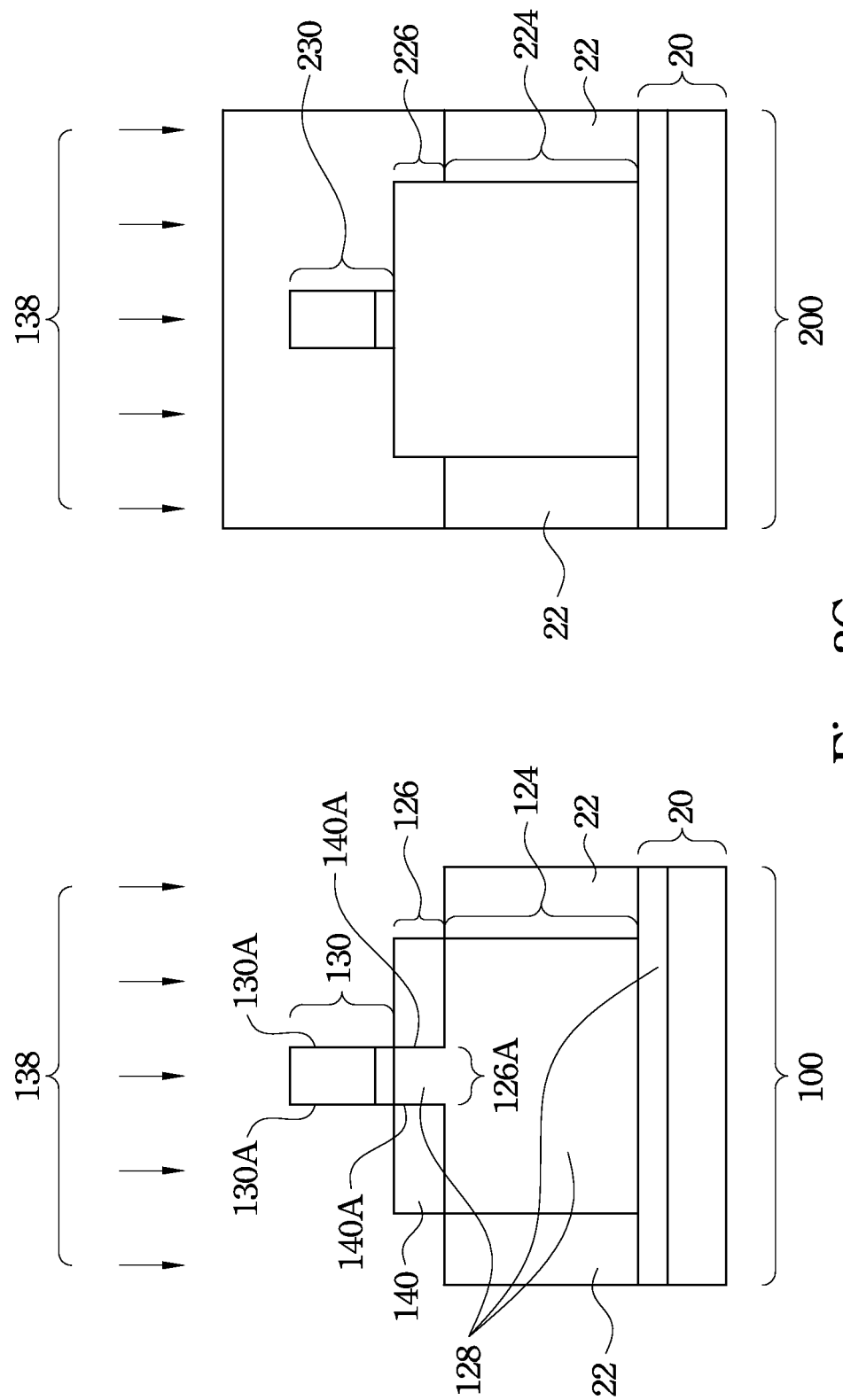

Next, referring to FIGS. 3A, 3B, and 3C, an n-type doping step is performed to implant an n-type impurity. The view shown in FIG. 3B is obtained from the plane crossing line 3B-3B in FIG. 3A, and the view shown in FIG. 3C is obtained from the planes crossing lines 3C-3C in FIG. 3A. To perform the implantation, mask 236 is first formed to protect the structures in region 200, wherein the structures in region 100 are exposed through mask 236. Mask 236 may be a photo resist, although other types of masks may be used. In accordance with some embodiments, the n-type doping step is performed through an implantation, wherein arrows 138 represent the implanted impurities and the respective implantation. As shown in FIGS. 3A and 3B, the implantation may include at least two tilted implantations tilted in opposite directions, wherein the tilt angle $\alpha$ (FIG. 3B) may be between about 10 degrees and about 50 degrees, although tilt angle $\alpha$ may be greater or smaller. As a result, implanted regions 140 (FIGS. 3A and 3C, referred to as n-type doped regions 140 hereinafter) are formed. Implanted regions 140 include exposed portions of semiconductor fins 126, and may, or may not, extend substantially into the underlying semiconductor strips 124, depending on the energy used in the implantation. The implanted n-type impurity comprises arsenic, phosphorous, antimony, or the like, although other n-type impurities such as nitrogen may also be used. After the implantation, the n-type impurity concentration in n-type doped regions 140 may be greater than about $5 \times 10^{19}/cm^3$, although the n-type impurity concentration may be lower.

Referring to FIG. 3B, in the vertical plane parallel to the longitudinal direction (the illustrated X direction in FIG. 3A) of gate stack 130, implantation 138 includes two implantations tilted in opposite directions, so that the entirety of fins 126 (FIG. 2) are doped with the n-type impurity, with the doping concentration throughout fins 126 being substantially uniform. Referring to FIG. 3C, in the plane parallel to the longitudinal direction (the illustrated Y direction in FIG. 3A) of fins 126 and 226 (FIG. 1), implantation 138 is substantially vertical, and is parallel to the planes in which edges 130A of gate stack 130 are located. Accordingly, edges 140A of n-type doped regions 140 are aligned to edges 130A of gate stack 130. In these embodiments, two tilted implantations may be used to form the profile of n-type doped regions 140 in FIG. 3C, although more tilted implantations may be performed. After implantation 138 is performed, mask 236 is removed.

Figure 4A:
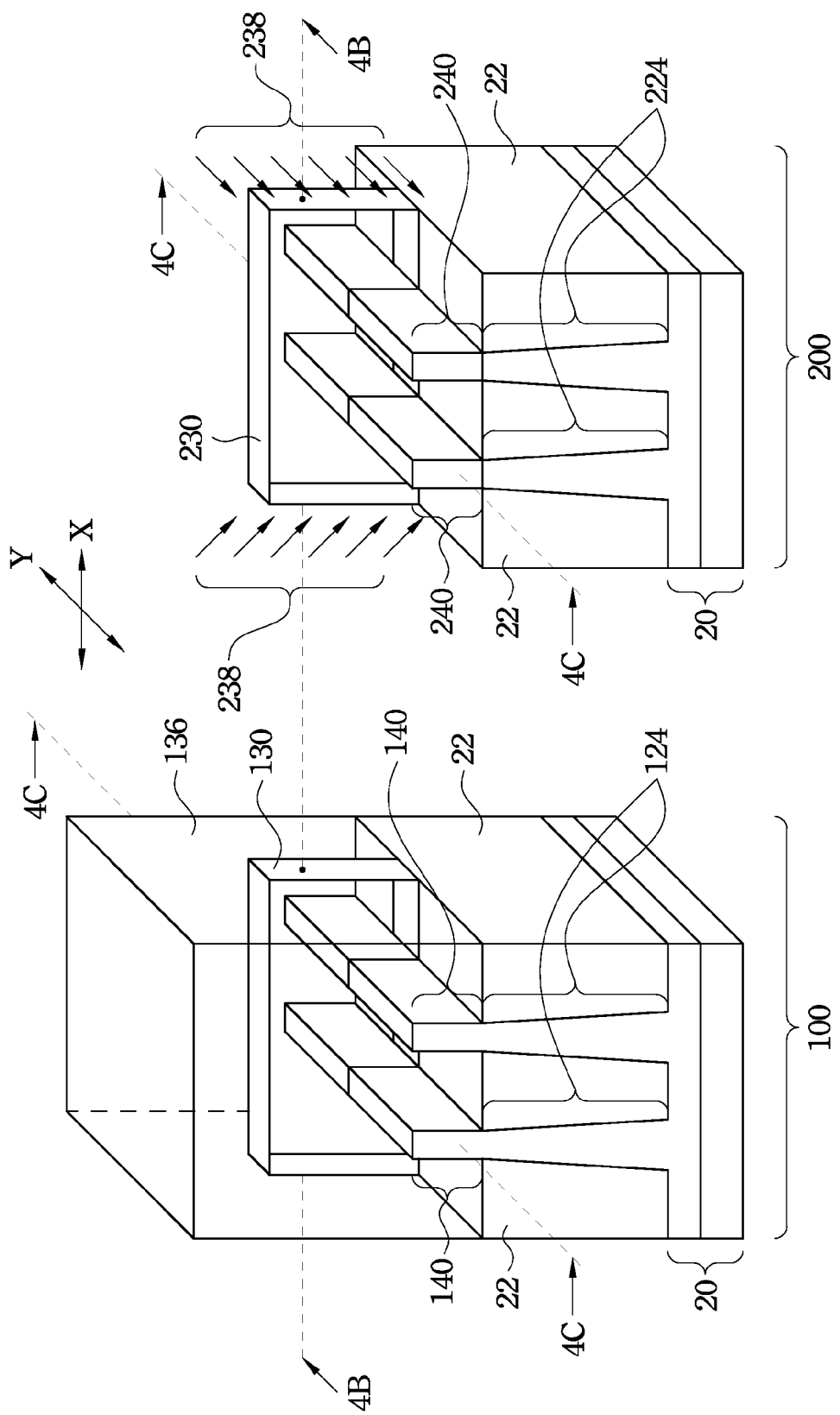
Figure 4B:
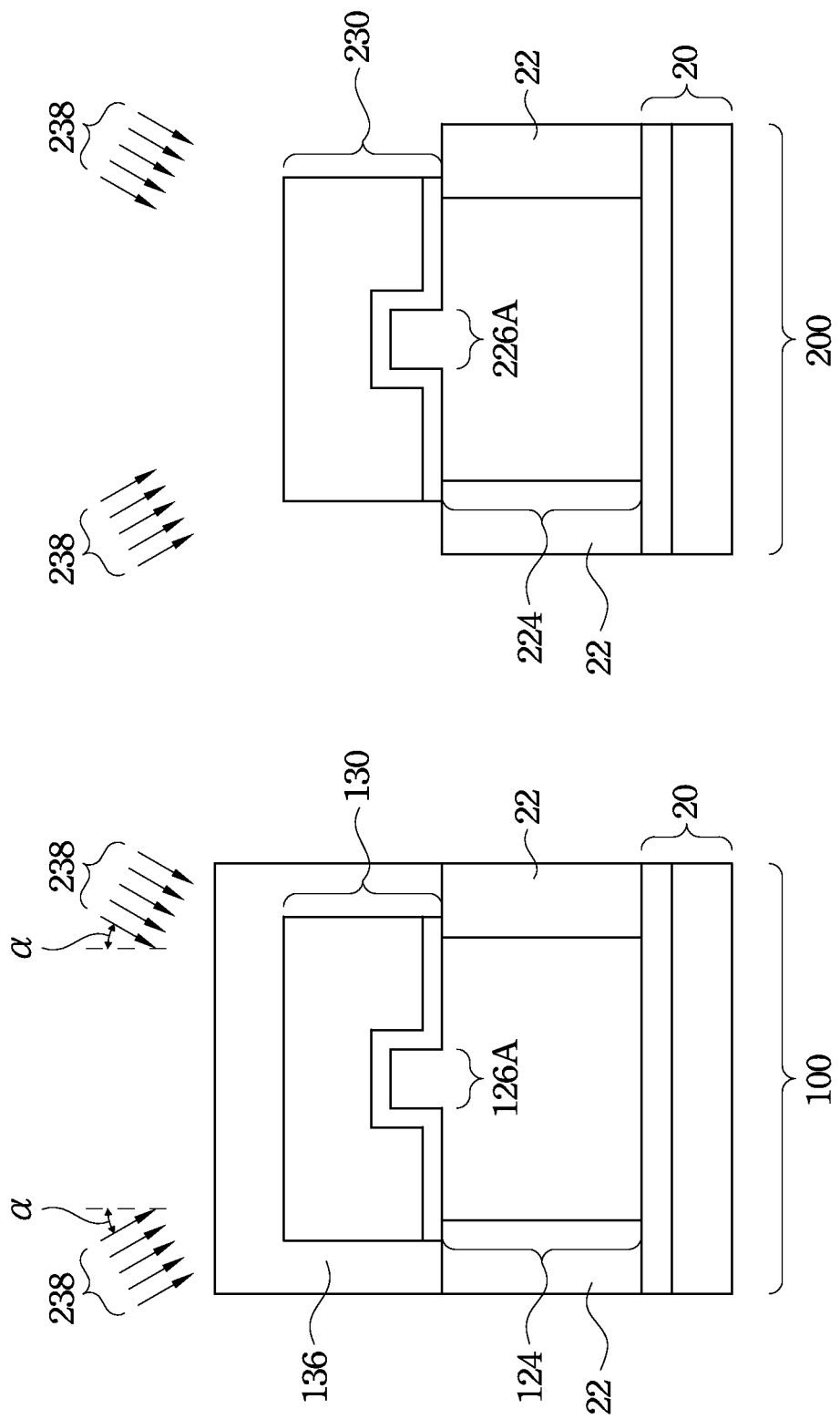
Figure 4C:
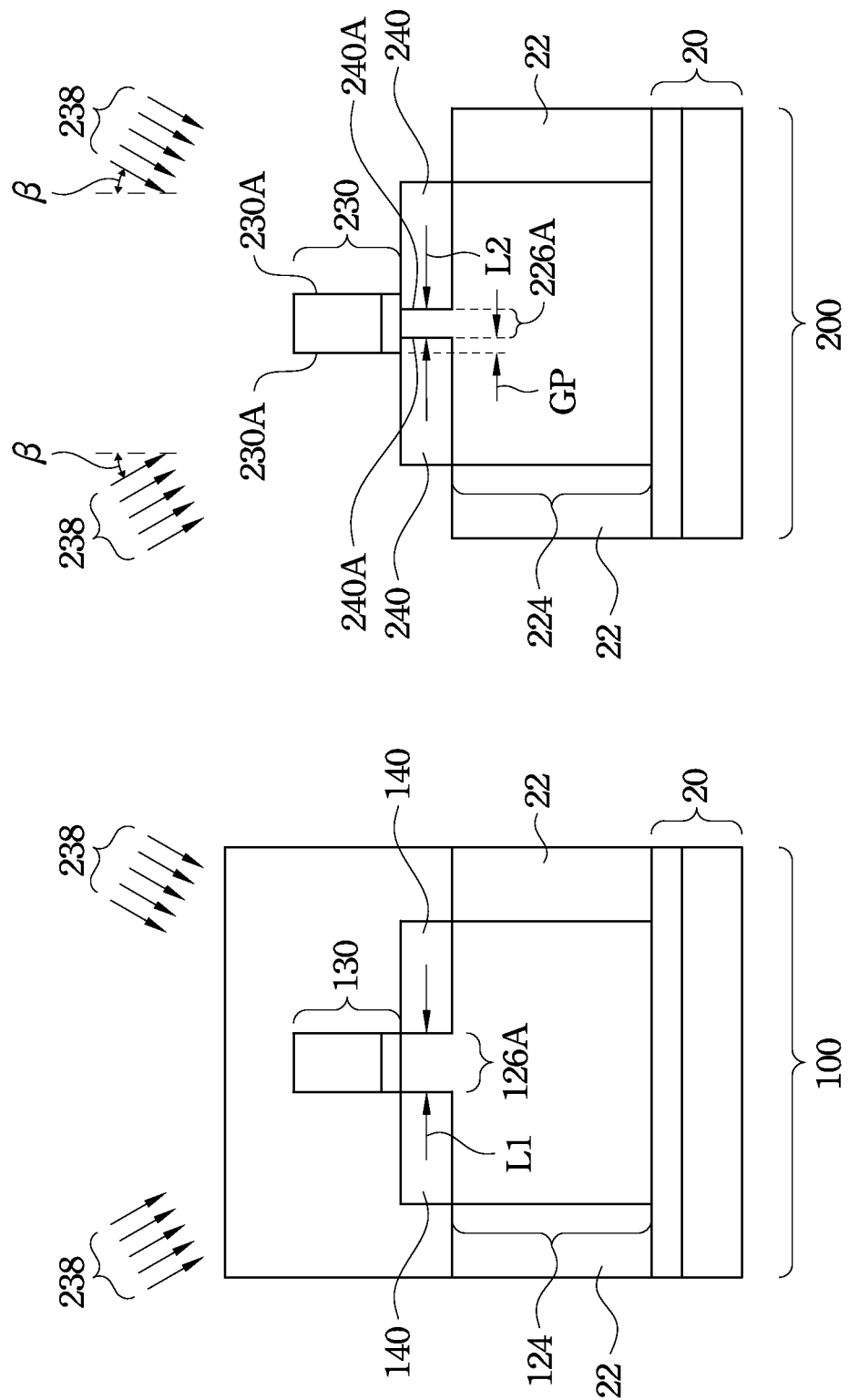

FIGS. 4A, 4B, and 4C illustrate implantation 238, in which an n-type impurity is doped. In some embodiments, the doping includes implanting an n-type impurity into the exposed portions of semiconductor fins 226 (FIG. 2) that are not covered by gate stack 230. As a result of implantation 238, n-type doped regions 240 are formed. As shown in FIG. 4A, in order to perform implantation 238, mask 136 is formed to protect the structures in region 100, wherein the structures in region 200 are exposed through mask 136. Mask 136 may be a photo resist in accordance with some embodiments. The plane shown in FIG. 4B is parallel to the X direction in FIG. 4A. As shown in FIG. 4B, implantation 238 includes a plurality of tilted implantations tilted in opposite directions, so that the entirety of the exposed portions of fins 226 are doped with the n-type impurity, with the doping concentration throughout fins 226 being substantially uniform. The tilt angles are denoted as $\alpha$.

Referring to FIG. 4C, in the plane parallel to the longitudinal direction (the illustrated Y direction in FIG. 4A), implantation 238 is not parallel to vertical edges 230A of gate stack 230, with the tilt angles being denoted as $\beta$. Accordingly, combining FIGS. 4B and 4C, four tilted implantations may be used to form the profile of n-type doped regions 240 in FIG. 4C, although more tilted implantations may be performed. Each of the four tilted implantations tilts to a direction different from the other three implantations. With the tilted implantations not parallel to vertical edges 230A of gate stack 230, n-type doped regions 240 extend under gate stack 230, as shown in FIG. 4C. The extending distance GP, which is referred to as a gate proximity, is the misalignment between edges 230A and edges 240A.

As also shown in to FIG. 4C, by adjusting tilt angle $\beta$ of the n-type implantation 238, the gate proximity GP may be adjusted. In some embodiments, tilt angle $\beta$ is between about 10 degrees and about 50 degrees, although tilt angle $\beta$ may be greater or smaller. Gate proximity GP affects the threshold voltage of the resulting FinFET, and the greater the gate proximity GP (when n-type doped regions 240 extend under gate stack 230) is, the smaller the threshold voltage the FinFET has. Therefore, in a same wafer, a plurality of FinFETs having different threshold voltages may be formed using the process shown in FIGS. 3A through 4C, with the formation of each of the plurality of FinFETs having a tilt angle $\beta$ different from the tilt angle used for forming other FinFETs.

FIG. 4C also illustrates that the steps shown in FIGS. 3A through 4C may result in the un-implanted, lightly n-type doped (for example, with a doping concentration smaller than about $5 \times 10^{18}/cm^3$), or p-type doped fin portions 126A and 226A to have different lengths L1 and L2. In accordance with some embodiments, the difference between lengths L1 and L2 may be controlled to have the increment of about 0.5 nanometers (about one mono layer of silicon), and the difference between lengths L1 and L2 may be one or a plurality of mono layers of silicon, depending on the desired threshold voltages of the resulting FinFETs.

Figure 5A:
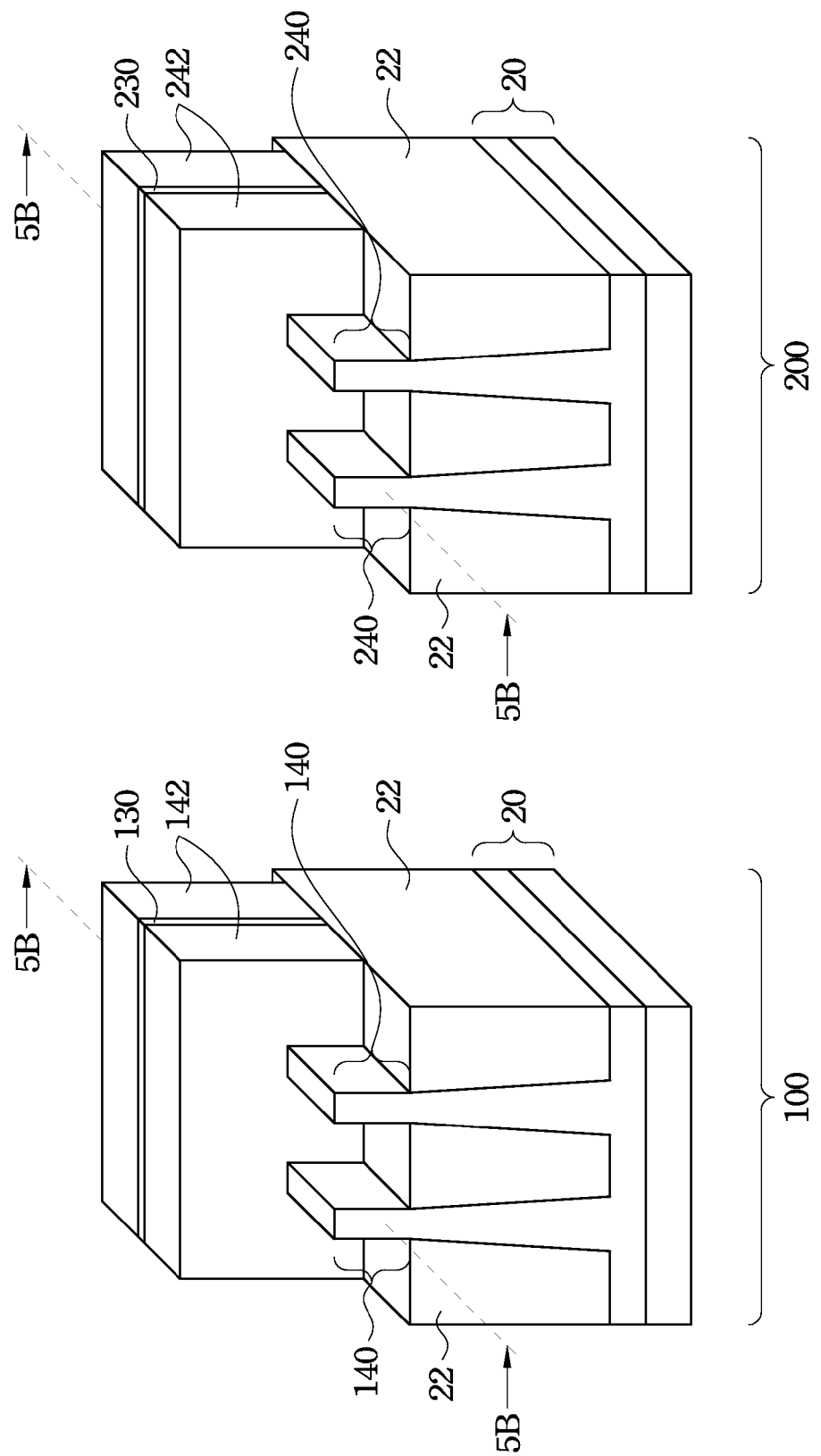
Figure 5B:
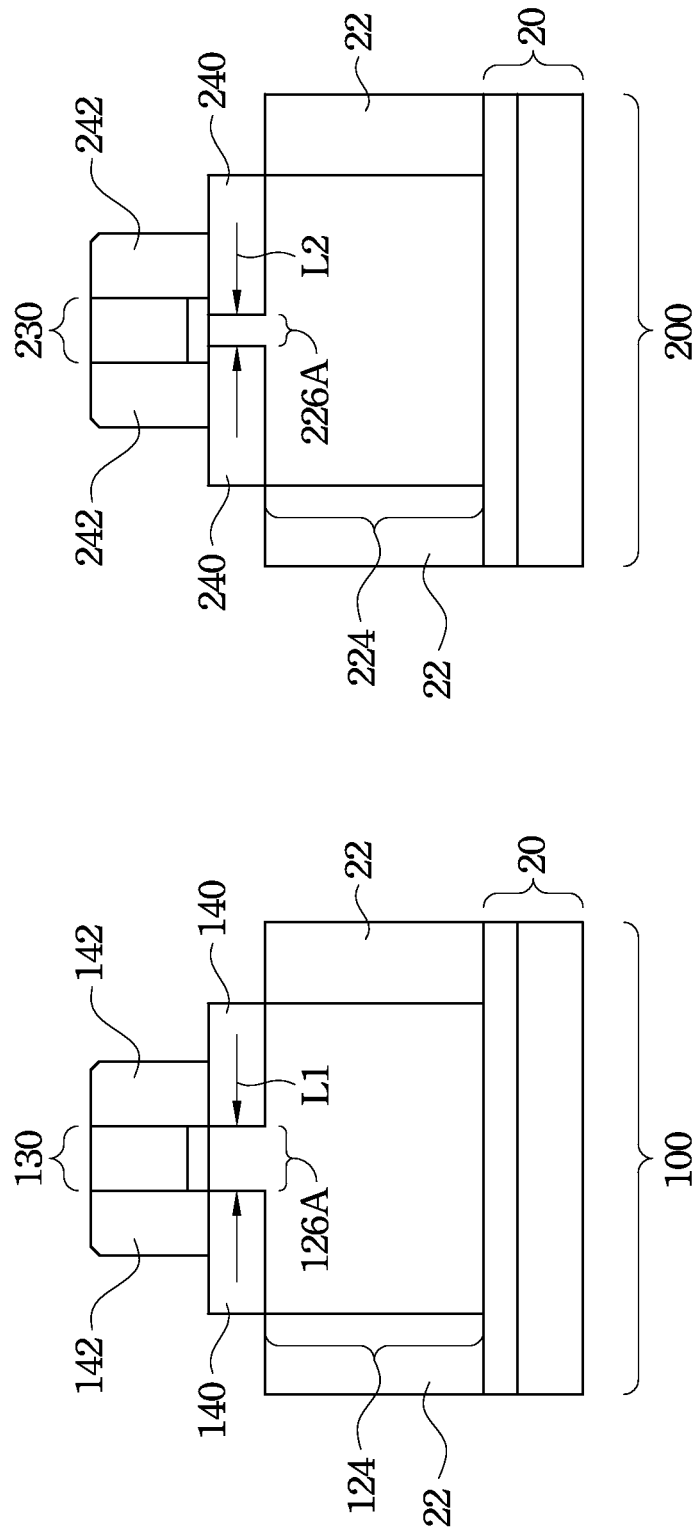

FIGS. 5A and 5B illustrate the formation of gate spacers 142 and 242, which are formed on the sidewalls of gate stacks 130 and 230, respectively. The view shown in FIG. 5B is obtained from the vertical plane crossing line 5B-5B in FIG. 5A. The formation process may include forming a conformal gate spacer layer (not shown), and performing an anisotropic etch to remove the horizontal portions of the gate spacer layer. The remaining portions of the gate spacer layer include gate spacers 142 and 242. Gate spacers 142 and 242 extend on, and overlap, n-type doped regions 140 and 240, respectively.

Figure 6A:
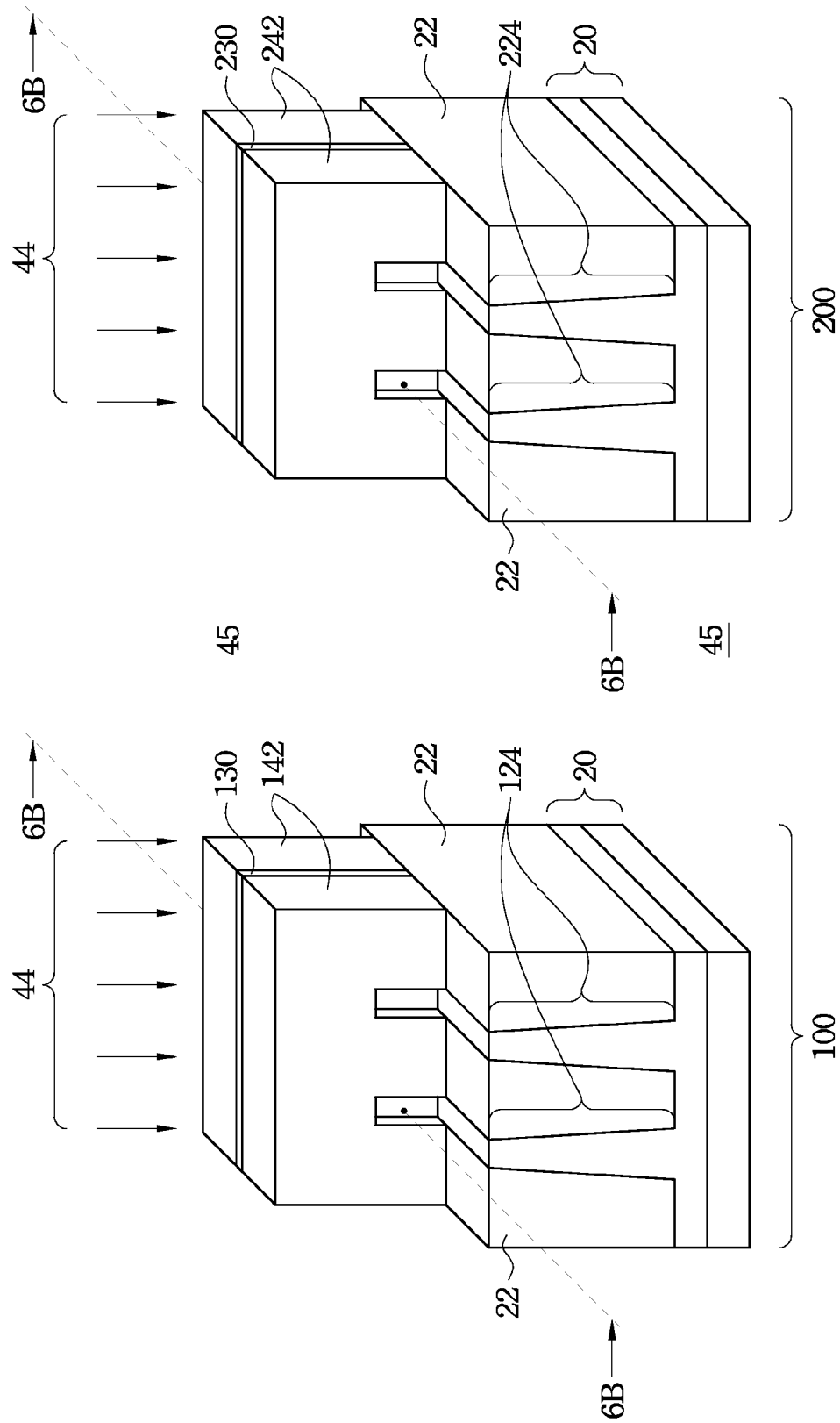
Figure 6B:
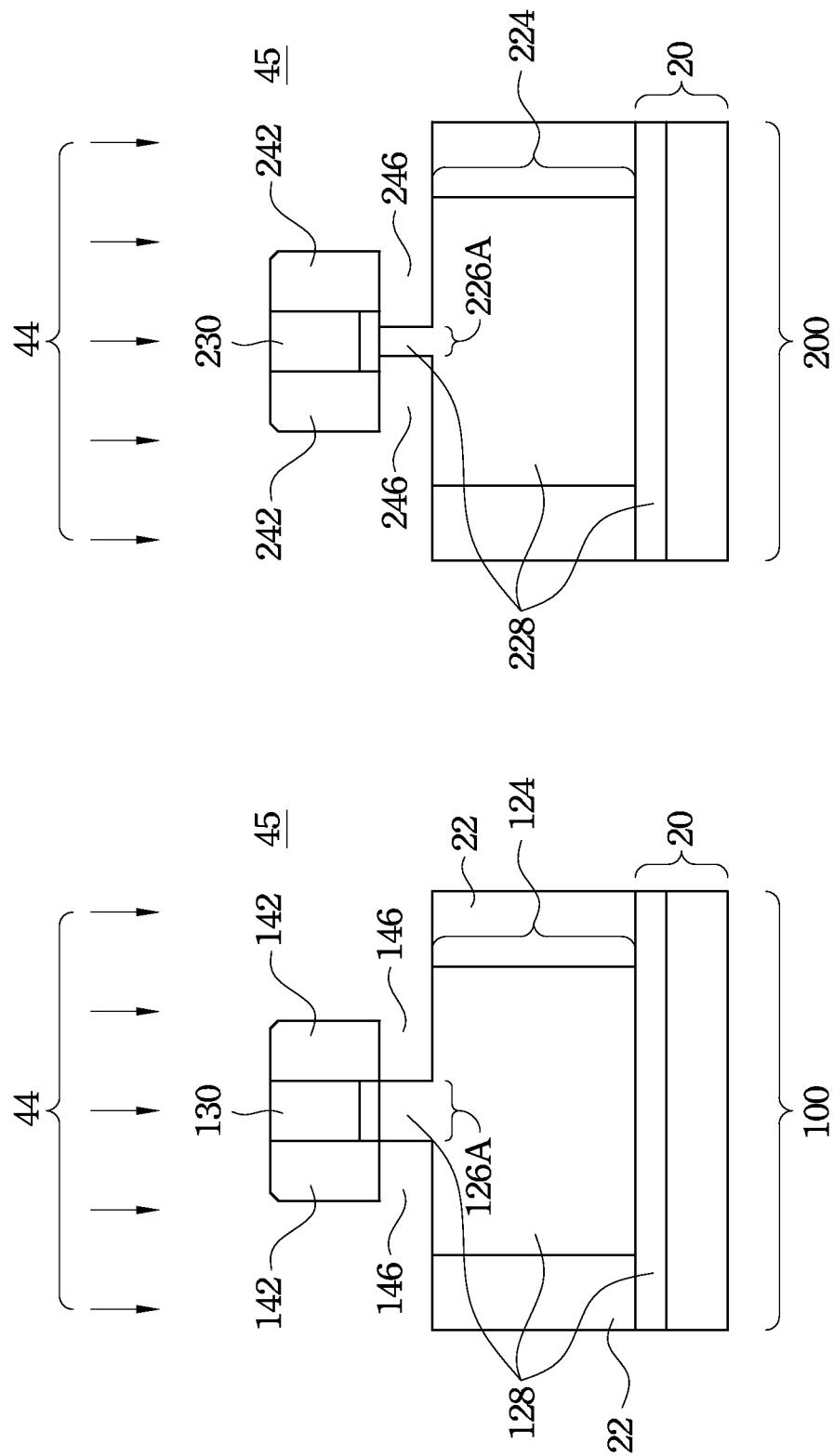

FIGS. 6A and 6B illustrate the etching of n-type doped regions 140 and 240, which may be etched simultaneously, although they may also be etched in different process steps. The etching may be performed in environment 45 (such as a vacuum chamber) in which radicals may exist. The view shown in FIG. 6B is obtained from the planes crossing lines 6B-6B in FIG. 6A. Throughout the description, the spaces left by the removed n-type doped regions 140 and 240 are referred to as recesses 146 and 246 (FIG. 6B), respectively. Arrows 44 represent chlorine (Cl) radicals, which are chlorine atoms without positive and negative charges. Chlorine radicals 44 are used for the etching of n-type doped regions 140 and 240. Chlorine radicals 44 may not be biased, and hence may not be uni-directional, although they are illustrated as directional arrows. In some embodiments, chlorine radicals 44 are generated through the generation of chlorine plasma, which may be filtered to filter out chlorine ions, and leave the chlorine radicals in the vacuum chamber for the etching of n-type doped regions 140 and 240. In alternative embodiments, besides chlorine radicals 44, chlorine ions (Cl⁻) may also be used for the etching of n-type doped regions 140 and 240. In these embodiments, chlorine ions are not filtered from the chlorine plasma.

During the etching of n-type doped regions 140 and 240, chlorine radicals 44 may penetrate into and attack the n-type doped regions 140 and 240 (FIG. 5A), so that n-type doped regions 140 and 240 are etched. The respective reaction is referred to as spontaneous reaction. Chlorine radicals 44 have the characteristic of forming a passivation at the surface of an un-doped (neutral) silicon, lightly n-type doped silicon (for example, with a doping concentration lower than about $5 \times 10^{18}/cm^3$), or the surface of a p-type doped silicon, so that the chlorine radicals cannot penetrate through the surface of the un-doped silicon, lightly doped n-type silicon, or the p-type doped silicon. Hence, chlorine radicals do not etch the un-doped silicon and the p-type doped silicon. Accordingly, referring to FIG. 6B, when well regions 128 and 228 are p-well regions, fin portions 126A and 260A are also of p-type, and are not etched. Conversely, when well regions 128 and 228 are n-well regions, fin portions 126A and 260A are of n-type. Since the n-well doping concentration in fin portions 126A and 260A is low and below the threshold dose of the silicon spontaneous reaction, fin portions 126A and 226A are substantially un-etched, and can be used as the etch stop layer in the etching of n-type regions 140 and 240. The respective etching of n-type doped regions 140 and 240 is thus self-aligned to where the respective impurities 138 and 238 (FIGS. 3A and 4A) are doped. Hence, through the accurate control of the n-type doping as in FIGS. 3A through 4C, the profile of fin portions 126A and 226A may be controlled accurately.

Experiment results indicated that with the doping concentration in well regions 128 and 228 being lower than about $1 \times 10^{18}/cm^3$, and n-type doped regions 140 and 240 having doping concentrations greater than about $5 \times 10^{19}/cm^3$, the subsequent etching of n-type doped regions 140 and 240 (FIGS. 5A and 5B) is fast enough, while fin portions 126A and 226 are not etched. This enables the etching of n-type doped regions 140 and 240 without etching fin portions 126A and 226A.

Figure 7A:
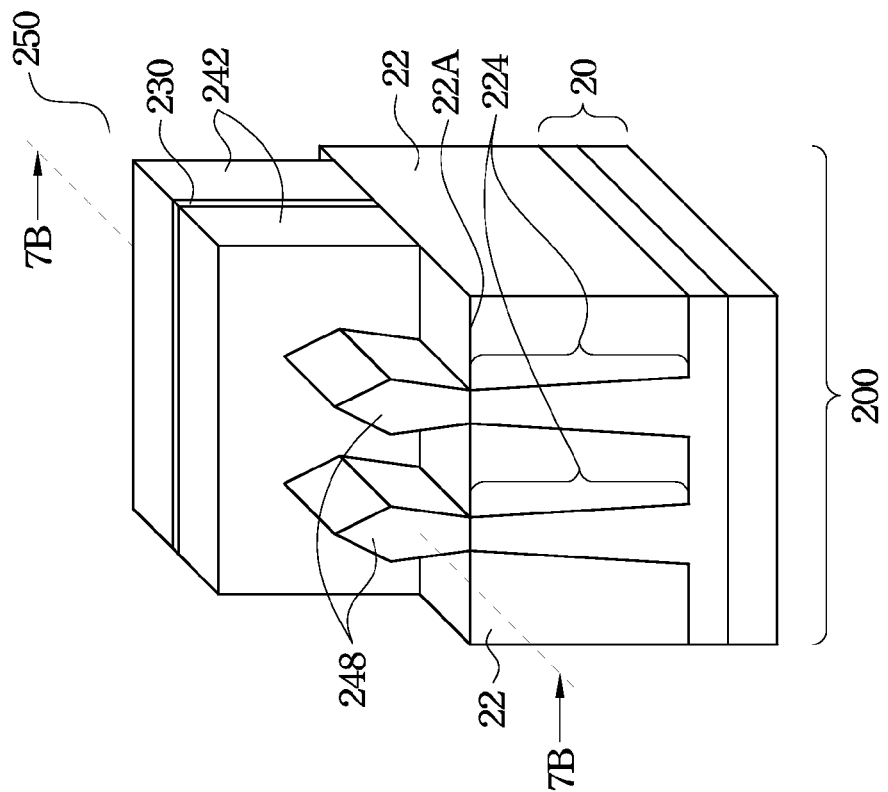
Figure 7A:
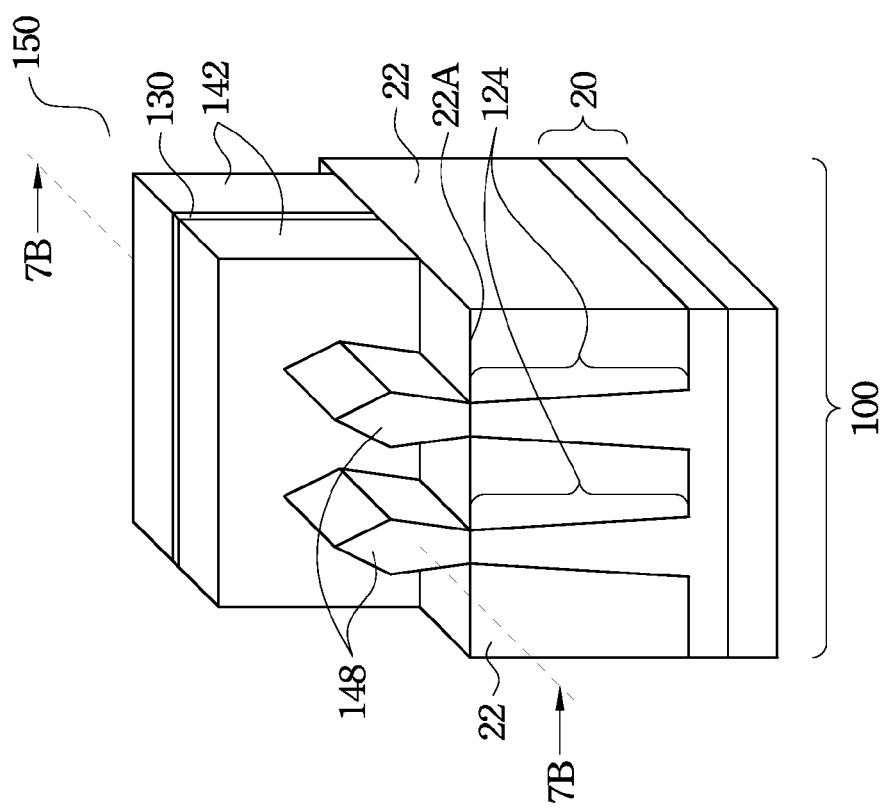
Figure 7B:
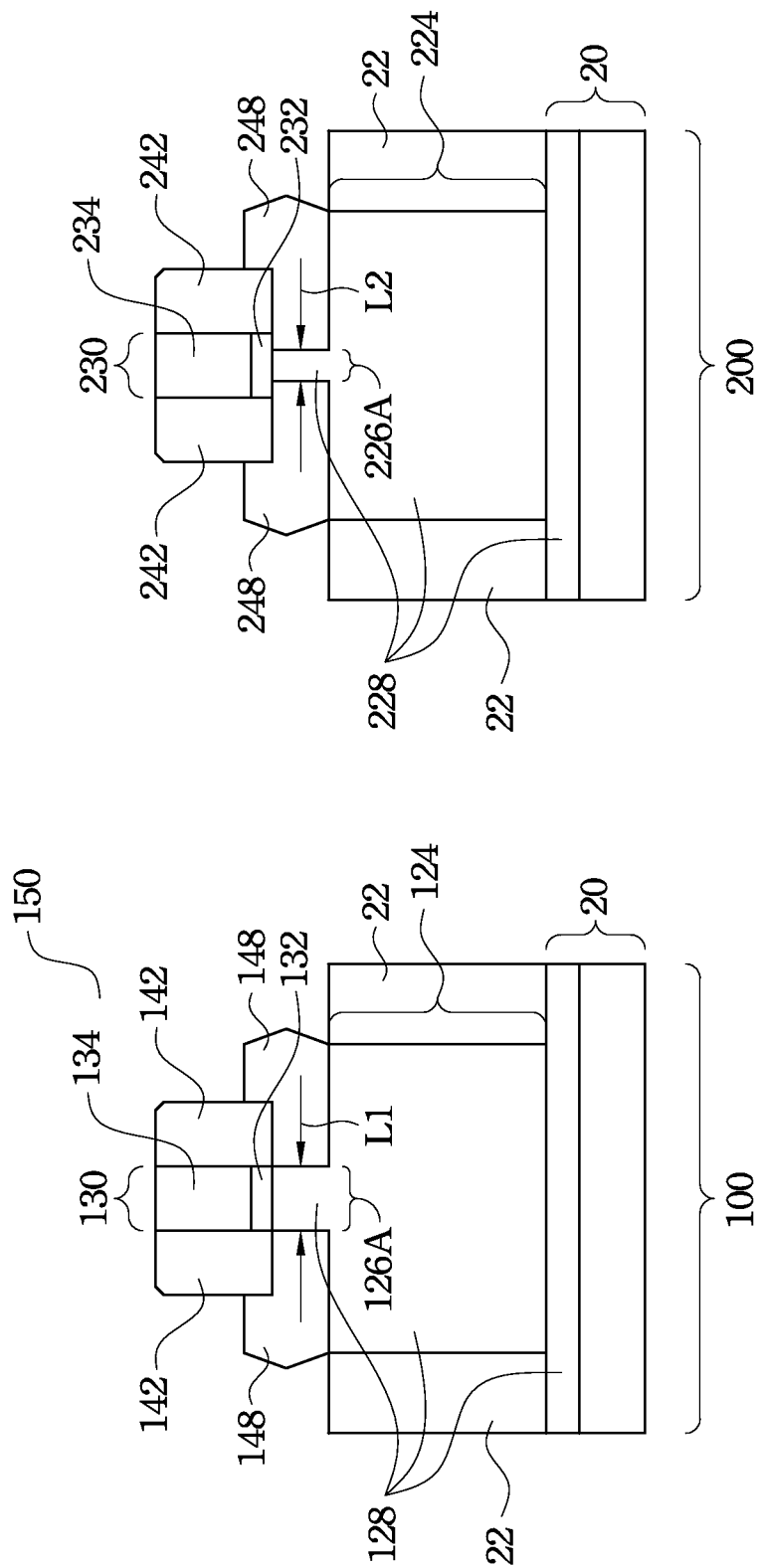

FIGS. 7A and 7B illustrate the epitaxial growth of epitaxy regions 148 and 248, which form the source and drain regions of the resulting FinFET 150 and 250. The view shown in FIG. 7B is obtained from the planes crossing lines 7B-7B in FIG. 7A. Epitaxy regions 148 and 248 are formed by selectively growing a semiconductor material in recesses 146 and 246 (FIG. 6B), respectively. In some exemplary embodiments in which well regions 128 and 228 are n-well regions, epitaxy regions 148 and 248 may comprise silicon germanium doped with a p-type impurity such as boron. The resulting FinFETs 150 and 250 are hence p-type FinFETs. In alternative exemplary embodiments in which well regions 128 and 228 are p-well regions, epitaxy regions 148 and 248 may comprise silicon doped with an n-type impurity such as phosphorous. The resulting FinFET 150 and 250 are hence n-type FinFETs. No source and drain extension regions are formed in accordance with some exemplary embodiments.

In the embodiments wherein gate stacks 130 and 230 are not dummy gate stacks, source/drain silicide regions, gate silicide regions, an Inter-Layer Dielectric (ILD), and source/drain contact plugs and gate contact plugs (not shown) may be further formed in subsequent process steps, which are not shown herein. In the alternative embodiments in which gate stacks 130 and 230 are dummy gate stacks, an ILD (not shown) may be formed to have a top surface level with the top surface of dummy gate stacks 130 and 230. Dummy gate stacks 130 and 230 are then removed, and are replaced by gate dielectrics and gate electrodes (not shown).

In the embodiments of the present disclosure, the profiles of the source and drain regions of the FinFETs may be controlled precisely, sometimes to the accuracy of a mono layer. Accordingly, the etching of the semiconductor fins and the epitaxy re-growth are free from some process variations such as pattern loading effect. This enables the accurate adjustment of threshold voltages of FinFETs through the adjustment of gate proximities. The difference between the gate proximities of two FinFETs may be controlled accurately to be integer times of mono layers of silicon. Accordingly, the control of the threshold voltages of FinFETs through the control of gate proximities has a high degree of accuracy. Furthermore, since chlorine radicals have a very low etching rate in etching gate stacks 130 and 230 and STI regions 22 (FIGS. 7A and 7B), the STI loss and gate loss is minimized.

In accordance with some embodiments, a method includes forming a first and a second gate stack to cover a first and a second middle portion of a first and a second semiconductor fin, respectively, and performing implantations to implant exposed portions of the first and the second semiconductor fins to form a first and a second n-type doped region, respectively. A portion of each of the first and the second middle portions is protected from the implantations. The first n-type doped region and the second n-type doped region have different gate proximities from edges of the first gate stack and the second stack, respectively. The first and the second n-type doped regions are etched using chlorine radicals to form a first and a second recess, respectively. An epitaxy is performed to re-grow a first semiconductor region and a second semiconductor region in the first recess and the second recess, respectively.

In accordance with other embodiments, a method includes forming a first gate stack to cover a middle portion of a first semiconductor fin, and forming a second gate stack to cover a middle portion of a second semiconductor fin. First end portions of the first semiconductor fin are implanted with a first n-type impurity to form first n-type doped regions on opposite sides of the middle portion of the first semiconductor fin. An edge of each of the first n-type doped regions is aligned to an edge of the first gate stack. Second end portions of the second semiconductor fin are implanted with a second n-type impurity to form second n-type doped regions on opposite sides of the middle portion of the second semiconductor fin. The second n-type doped regions are overlapped by the second gate stack. The first end portions and the second end portions are etched simultaneously using chlorine radicals to form first recesses and second recesses, respectively. The etching step is stopped when the first and the second n-type doped regions are substantially fully removed. An epitaxy is performed to re-grow first semiconductor regions and second semiconductor regions in the first recesses and the second recesses, respectively. The first semiconductor regions form source and drain regions of a first FinFET. The second semiconductor regions form source and drain regions of a second FinFET having a same conductivity type as the first FinFET.

In accordance with yet other embodiments, a method includes forming a first gate stack to cover a first middle portion of a first semiconductor fin, and forming a second gate stack to cover a second middle portion of a second semiconductor fin. First end portions of the first semiconductor fin are implanted with an n-type impurity to form first n-type doped regions on opposite sides of the first middle portion. A portion of the first middle portion is un-implanted or lightly n-type or p-type doped, and forms a first un-implanted or lightly n-type or p-type doped region adjoining the first n-type doped regions. Second end portions of the second semiconductor fin are implanted with the n-type impurity to form second n-type doped regions on opposite sides of the second middle portion. A portion of the second middle portion is un-implanted or lightly n-type or p-type doped, and forms a second un-implanted or lightly n-type or p-type doped region adjoining the second n-type doped regions. The first n-type doped regions and the second n-type doped regions are etched simultaneously to form first recesses and second recesses, wherein the etching step stops on the first and the second un-implanted regions. An epitaxy is performed to simultaneously re-grow first semiconductor regions and second semiconductor regions starting from the first and the second un-implanted regions, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming a first gate stack to cover a first middle portion of a first semiconductor fin;
forming a second gate stack to cover a second middle portion of a second semiconductor fin;
performing a first implantation to implant an exposed portion of the first semiconductor fin with an n-type impurity to form a first n-type doped region, wherein a portion of the first middle portion is protected by the first gate stack from receiving the n-type impurity;
performing a second implantation to implant an exposed portion of the second semiconductor fin with an additional n-type impurity to form a second n-type doped region, wherein a portion of the second middle portion is protected by the second gate stack from receiving the additional n-type impurity, and wherein the first n-type doped region and the second n-type doped region have different gate proximities from edges of the first gate stack and the second stack, respectively;
etching the first n-type doped region using chlorine radicals to form a first recess;
etching the second n-type doped region using the chlorine radicals to form a second recess; and
performing an epitaxy to re-grow a first semiconductor region and a second semiconductor region in the first recess and the second recess, respectively.

2. The method of claim 1 further comprising doping the first semiconductor region and the second semiconductor region to a same conductivity type, wherein the first semiconductor region and the second semiconductor region are portions of a first FinFET and a second FinFET, respectively.

3. The method of claim 1, wherein the first n-type doped region has an edge aligned to an edge of the first gate stack, and wherein the second n-type doped region overlaps a portion of the second gate stack.

4. The method of claim 1, wherein the step of etching the first n-type doped region and the step of etching the second n-type doped region are performed simultaneously.

5. The method of claim 1 further comprising:
generating a chlorine plasma; and
filtering the plasma to filter out chlorine ions, and leave the chlorine radicals.

6. The method of claim 1, wherein the first n-type doped region and the second n-type doped region are implanted to have n-type impurity concentrations higher than about $5 \times 10^{18}/cm^3$.

7. The method of claim 1, wherein the first implantation and the second implantation comprise implanting arsenic.

8. A method comprising:
forming a first gate stack to cover a middle portion of a first semiconductor fin;
forming a second gate stack to cover a middle portion of a second semiconductor fin;
implanting first end portions of the first semiconductor fin with a first n-type impurity to form first n-type doped regions on opposite sides of the middle portion of the first semiconductor fin, wherein an edge of each of the first n-type doped regions is aligned to an edge of the first gate stack;
implanting second end portions of the second semiconductor fin with a second n-type impurity to form second n-type doped regions on opposite sides of the middle portion of the second semiconductor fin, wherein the second n-type doped regions are overlapped by the second gate stack;
etching the first end portions and the second end portions simultaneously using chlorine radicals to form first recesses and second recesses, respectively, wherein the etching step is stopped when the first and the second n-type doped regions are substantially fully removed; and
performing an epitaxy to re-grow first semiconductor regions and second semiconductor regions in the first recesses and the second recesses, respectively, wherein the first semiconductor regions form source and drain regions of a first Fin Field-Effect Transistor (FinFET), and the second semiconductor regions form source and drain regions of a second FinFET having a same conductivity type as the first FinFET.

9. The method of claim 8, wherein during the step of etching, the chlorine radicals are non-uni-directional.

10. The method of claim 8, wherein the steps of implanting the first end portions of the first semiconductor fin comprises two tilt implantations tilted in opposite directions, and wherein during the two tilt implantations, the first n-type impurity is implanted in directions parallel to edges of the first gate stack.

11. The method of claim 8, wherein the step of implanting the second end portions of the second semiconductor fin comprises four tilt implantations tilted in opposite directions, and wherein during the four tilt implantations, the second n-type impurity is implanted in directions un-parallel to planes of edges of the second gate stack.

12. The method of claim 8, wherein the step of etching is performed in an environment, with substantially no chlorine ions in the environment.

13. The method of claim 8, wherein the step of etching is performed in an environment, with chlorine ions exist in the environment.

14. The method of claim 8, wherein the n-type doped regions are doped to have an n-type impurity concentration higher than about $5 \times 10^{19}/cm^3$.

15. The method of claim 8, wherein the step of implanting the first end portions and the step of implanting the second end portions comprise implanting arsenic.

16. A method comprising:
forming a first gate stack to cover a first middle portion of a first semiconductor fin;
forming a second gate stack to cover a second middle portion of a second semiconductor fin;
implanting first end portions of the first semiconductor fin with an n-type impurity to form first n-type doped regions on opposite sides of the first middle portion, wherein a portion of the first middle portion is un-implanted, and forms a first un-implanted region adjoining the first n-type doped regions;
implanting second end portions of the second semiconductor fin with the n-type impurity to form second n-type doped regions on opposite sides of the second middle portion, wherein a portion of the second middle portion is un-implanted, and forms a second un-implanted region adjoining the second n-type doped regions;
etching the first n-type doped regions and the second n-type doped regions simultaneously to form first recesses and second recesses, wherein the etching step stops on the first and the second un-implanted regions; and
performing an epitaxy to simultaneously re-grow first semiconductor regions and second semiconductor regions starting from the first and the second un-implanted regions, respectively.

17. The method of claim 16, wherein the step of etching is performed using chlorine radicals, and wherein the chlorine radicals are non-uni-directional.

18. The method of claim 16, wherein the first and the second un-implanted regions are doped with a p-type impurity.

19. The method of claim 16, wherein the first and the second un-implanted regions are doped with an n-type impurity having an n-type impurity concentration lower than about $5 \times 10^{18}/cm^3$.

20. The method of claim 16, wherein the step of implanting the first end portions and the step of implanting the second end portions comprise implanting arsenic.

* * * * *